United States Patent
Wang et al.

(10) Patent No.: US 6,853,490 B2
(45) Date of Patent: Feb. 8, 2005

(54) METHOD AND APPARATUS FOR ILLUMINATING A SPATIAL LIGHT MODULATOR WITH LIGHT FROM MULTIPLE LASER DIODE ARRAYS

(75) Inventors: Tangyu Wang, Coquitlam (CA); Ichiro Shinkoda, Vancouver (CA); Kobi Goldstein, Vancouver (CA); Meritt Wayne Reynolds, Burnaby (CA)

(73) Assignee: Creo Inc., Burnaby (CA)

( * ) Notice: Subject to any disclaimer, the term of this patent is extended or adjusted under 35 U.S.C. 154(b) by 28 days.

(21) Appl. No.: 10/260,628

(22) Filed: Oct. 1, 2002

(65) Prior Publication Data

US 2003/0063391 A1 Apr. 3, 2003

(30) Foreign Application Priority Data

Oct. 1, 2001 (CA) ............................................. 2358169

(51) Int. Cl.[7] ............................................... G02C 27/10
(52) U.S. Cl. ...................................... 359/621; 359/622
(58) Field of Search ................................ 359/621, 622, 359/623, 624, 618, 626

(56) References Cited

U.S. PATENT DOCUMENTS

| | | |
|---|---|---|
| 4,716,568 A | 12/1987 | Scifres et al. |
| 5,309,178 A | 5/1994 | Gross |
| 5,426,452 A | 6/1995 | Davis et al. |
| 5,475,416 A | 12/1995 | Kessler et al. |
| 5,517,359 A | 5/1996 | Gelbart |
| 5,666,226 A * | 9/1997 | Ezra et al. .................. 359/621 |
| 5,745,153 A | 4/1998 | Kessler et al. |
| 5,793,783 A | 8/1998 | Endriz |
| 5,802,034 A | 9/1998 | Gelbart |
| 5,831,659 A | 11/1998 | Baek et al. |
| 5,861,992 A | 1/1999 | Gelbart |
| 5,875,160 A | 2/1999 | Harigaya et al. |
| 5,923,475 A | 7/1999 | Kurtz et al. |
| 5,946,333 A | 8/1999 | Kappeler |
| 5,995,475 A | 11/1999 | Gelbart |
| 6,037,965 A | 3/2000 | Gross et al. |
| 6,064,528 A | 5/2000 | Simpson, Jr. |
| 6,240,116 B1 | 5/2001 | Lang et al. |

* cited by examiner

*Primary Examiner*—Hung Xuan Dang
(74) *Attorney, Agent, or Firm*—Oyen Wiggs Green & Mutala

(57) ABSTRACT

Apparatus for illuminating a spatial light modulator combines radiation from two or more multiple-emitter laser diode arrays. Brightness is conserved. The apparatus includes collecting optics which includes an array of microlenses. The microlenses steer beams of radiation which issue from individual emitters so that the beams overlap at a target plane to produce a desired beam profile.

25 Claims, 4 Drawing Sheets

METHOD AND APPARATUS FOR ILLUMINATING A SPATIAL LIGHT MODULATOR WITH LIGHT FROM MULTIPLE LASER DIODE ARRAYS

TECHNICAL FIELD

This invention relates generally to the field of semiconductor laser diodes and more particularly to semiconductor laser diodes which have linear arrays of emitters. The invention relates particularly to methods and apparatus which combine laser radiation from two or more such diodes to illuminate a spatial light modulator.

BACKGROUND

Semiconductor laser diodes are used in many applications where compact size and/or high efficiency is important. Semiconductor laser diodes offer relatively low cost, high reliability and simplicity of use.

Single emitter multi-mode laser diodes are commonly available in various wavelengths with radiation power output up to 2 Watts or more. These lasers typically have a rectangular or stripe emitter around 1 $\mu$m high and in the range of approximately 20 $\mu$m–500 $\mu$m long. Fundamental problems of heat removal and optical emitter facet damage limit the power that can be emitted per unit length of emitter without significantly reducing the operating lifetime of such laser diodes.

For applications requiring more than a few Watts of radiation power it is common to use an array of single emitter diodes. One could form such an array by mounting single emitter diodes on a mechanical support. It is more common to fabricate the array of emitters on a monolithic substrate. These devices, known as laser diode bars, are available in many configurations with radiation power of up to 50 Watts.

A monolithic laser diode array 1 is shown in FIG. 1. It has a semiconductor substrate 2 which carries an array of emitters 3. Adjacent emitters have a dead space between them that does not emit light. Due to emitter geometry, radiation beam 4 is substantially asymmetrical and has differing divergence rates in the x-axis and y-axis directions. The full-width divergence in the y-axis is typically in the range of 40° to 100° and in the x-axis, 8° to 20°. The y-axis may be referred to as the "fast" axis while the x-axis may be referred to as the "slow" axis. The high beam divergence of semiconductor diode lasers makes it necessary to collimate or focus the beams emitted by such lasers for most applications.

The beam quality in the y-axis can be very good, with an M2 value of close to 1.0. M2 is a dimensionless parameter that characterizes the degree of imperfection of a laser beam. An ideal, diffraction-limited, Gaussian profile beam would have an M2 of 1.0. Any departure from the ideal results in an M2 value of greater than 1.0. The M2 of the beam from a laser diode in the x-axis is very poor, signifying a substantial deviation from a perfect beam. This difference in the beam quality, along with the differing divergence rates for the x and y axes, make it necessary to treat the axes separately when designing a collimation scheme.

Spatial light modulators offer an advantage in imaging in that they can be fabricated as multi-channel devices, thus reducing system complexity while increasing imaging speed. Spatial light modulators are optical modulators constructed to spatially modulate, according to prescribed input, a readout optical beam. Spatial light modulators having a single line of modulating elements or areas are of particular use in imaging tasks although in some applications multi-line devices can also be advantageous. Examples of spatial light modulators include a wide range of electro-optical, acousto-optical, and electromechanical devices.

While laser diode bars have several advantages for illuminating a spatial light modulator one must first overcome the challenges set the by format of the laser diode beam. For optimal illumination of a line spatial light modulator, the laser bar radiation must be precisely transformed into a line of uniform illumination in a manner that maximizes brightness. Brightness is defined as the luminous flux emitted from a surface per unit solid angle per unit of area.

U.S. Pat. No. 5,517,359, to Gelbart discloses a method of formatting the output from a laser diode to form a line source which is particularly useful for illuminating a spatial light modulator. Radiation from each emitter of the laser diode is fully overlapped at the modulator in both the x and y axes. A cylindrical microlens collimates the radiation in the y-axis. In the x-axis an array of cylindrical microlens elements collimate and steer the radiation towards a common target point, some distance from the laser, overlapping the radiation profiles.

The overlapping of emitter radiation profiles is advantageous should one or more emitters fail. Since the overall profile is the sum of a plurality of emitters, an emitter failure only reduces power and does not substantially change the profile. In contrast, if only the fast axis is collimated and the slow axis is allowed to diverge up to a point where the beams overlap only partially, an emitter failure will severely compromise the profile. Another advantage of overlapping is that dead space between emitters is effectively removed, creating a high brightness illumination line.

A problem that occurs in using many laser diodes bars is that, as a result of stress-induced bending of the device wafer, the emitters are not in a perfectly straight line; a characteristic known as "smile". While bars have been manufactured with sub-micron smile, it is more common to have to deal with around 5–10 $\mu$m of smile. A non-negligible smile prevents precisely aligning the beams in the y-axis and thus degrades line quality.

U.S. Pat. No. 5,861,992 to Gelbart provides an individual microlens in front of each emitter. The microlens is adjusted in the y-axis direction to line up all emitter radiation profiles at a target plane. The microlenses collimate radiation from the emitters in both axes and additionally can be used to steer the emitter profiles to overlap in the x-axis direction. The microlenses are individually sliced from the center of a molded aspheric lens, such that each slice is substantially the same as the diode array pitch.

Advances in semiconductor materials have lead to the available power from laser diodes bars more than doubling over the past few years. However, despite these advances, it is unlikely that there will be a further doubling of power levels in the near future unless there is a significant breakthrough in the art. On the other hand, applications continue to demand higher overall laser powers.

U.S. Pat. No. 4,716,568 discloses a plurality of linear diode laser array subassemblies stacked one above the other and simultaneously powered from a single source. In this configuration, power can easily be scaled by simply adding more laser diode arrays. The downside is that it is very difficult to design combination systems that deal with the radiation asymmetry while simultaneously preserving brightness for a vertical stack. While this combination scheme is effective at increasing the power available, the loss of brightness counters much of the gain, particularly for demanding imaging applications.

U.S. Pat. No. 6,240,116 discloses a stepped reflector that can be used to combine beams from multiple laser diodes, simultaneously correcting some of the asymmetry while conserving brightness. However the stepped reflector is a complex component to manufacture and adds to system cost and complexity. The stepped reflector does not avoid the need for a separate microlens for each emitter to achieve a good profile.

Accordingly, there is a need for apparatus and methods for combining the beams from two or more laser diode arrays to achieve higher power than is available from a single bar diode. There is a particular need for such methods and apparatus which:

combine radiation in such a way that brightness is maximized;

are simple and cost effective;

preserve the beam quality in the y-axis so that a substantially Gaussian profile is maintained; and, combine the beams in such a manner that the far field profiles are substantially uniform in the x-axis.

SUMMARY OF INVENTION

This invention provides methods for constructing illumination sources for spatial light modulators from two or more multiple emitter laser diode arrays. The invention also provides apparatus for illuminating spatial light modulators and systems which incorporate such apparatus. By mounting two laser diode arrays adjacent to each other and providing optics operative to collect and steer the radiation towards a target plane the radiation of two or more laser diodes can be combined while maintaining beam quality and brightness.

BRIEF DESCRIPTION OF THE DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

This invention involves combining the radiation of two or more laser diode bars. More specifically the invention relates to combining the radiation of two or more diode bars mounted side by side. Collecting optics are placed in front of the bars to format and direct the radiation to form a radiation profile. The radiation profile illuminates a spatial light modulator.

In this disclosure the term "laser diode array" or "array" refers to an array of emitters. The emitters may be mounted on a monolithic semiconductor substrate. The term "laser diode bar" or "bar" refers to a laser diode array mounted on a base. The base provides for mounting electrical connections and/or heat removal. Many commercially available laser diode arrays are provided incorporated into laser diode bars.

An "optical element" is any element capable of changing one or more properties of a beam of light. A lens is an example of an optical element. A "microlens" is a small lens. A mirror is another example of an optical element.

"Collecting" means gathering diverging light from a source, such as a set of laser diode emitters and forming a collimated or converging beam of light directed toward a target plane. "Collecting optics" means a set of one or more optical elements that perform the function of collecting. Collecting optics may focus radiation at the target plane but this is not necessarily required in all cases.

Figure 3:
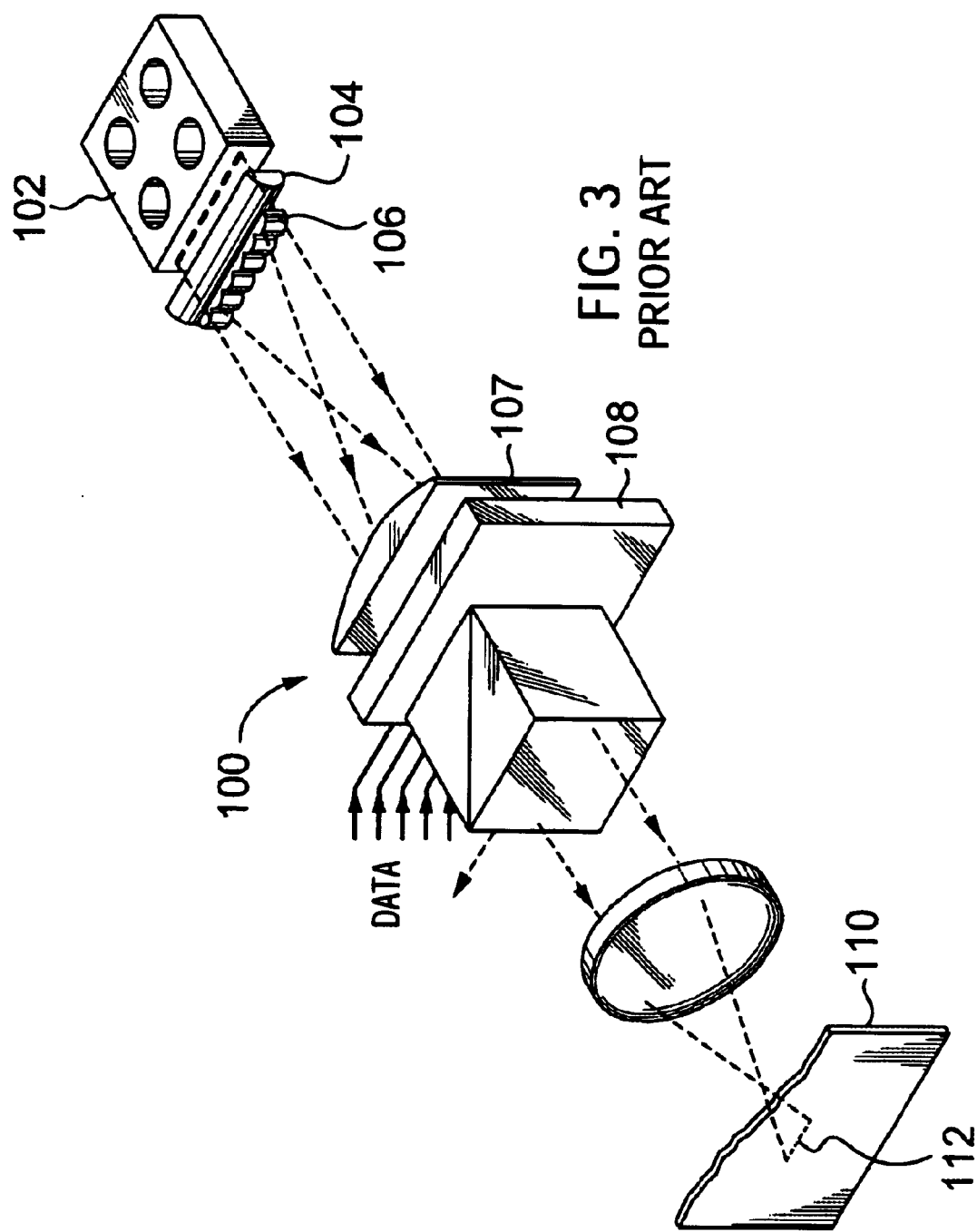
FIG. 3 illustrates the use of a single laser diode array to illuminate a spatial light modulator.

FIG. 3 illustrates a prior art system 100 which includes a spatial light modulator. Light from a single laser diode bar 102 is collected by optical elements 104, 106 and 107 to form a linear radiation pattern which illuminates a spatial light modulator 108. Light modulated by spatial light modulator 108 is directed to impinge upon a recording medium 110 in a modulated line 112.

Figure 4:
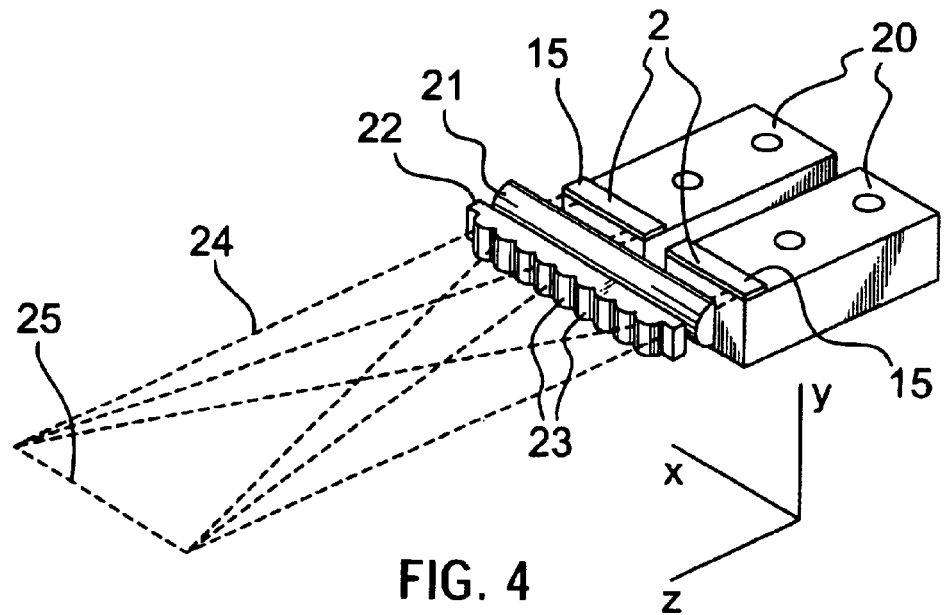
FIG. 4 depicts a particular embodiment that combines the radiation from two individual laser diode bars to form a single high power line source.

FIG. 4 shows a pair of laser diode bars 15 each comprising a laser diode array 2 mounted on a base 20. A common microlens 21 collects the y-axis radiation for both lasers. Microlens array 22, comprising microlenses 23, collects the x-axis radiation from each emitter. Microlenses 23 also steer beams 24 from each emitter in the x-z plane, to form an overlapped line profile 25 at a point some distance away from diode bars 15. Laser diode bars 15 and optical elements are mounted on a rigid support base (not shown). The apparatus shown in FIG. 4 may be applied to illuminating a spatial light modulator in place of the single laser diode bar 102 and collection optics 104 and 106 of FIG. 3.

Figure 1:
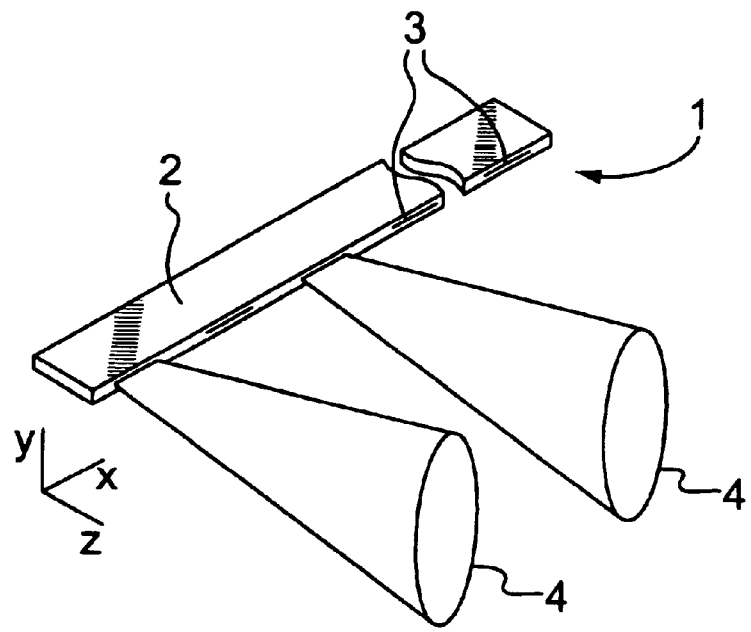
FIG. 1 depicts a generic prior art laser diode array.
Figure 2:
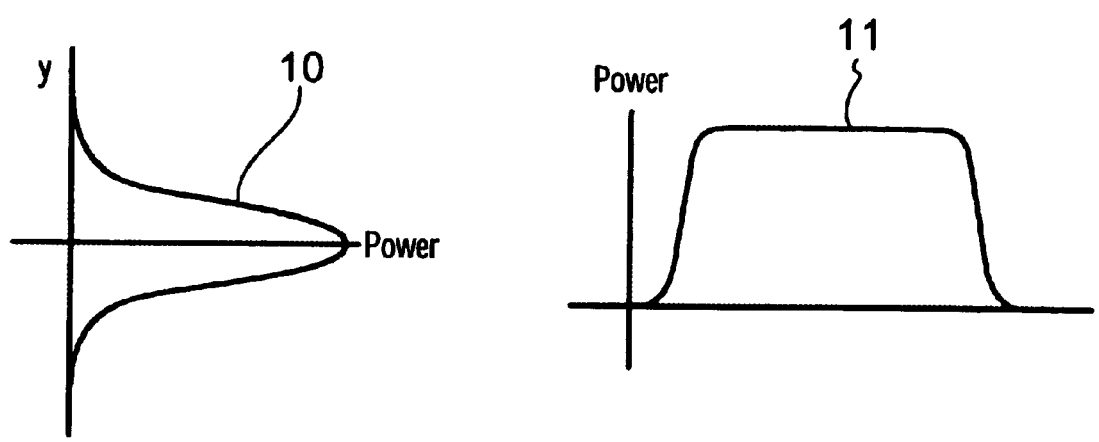
FIG. 2 is a graphical depiction of the far field profile of an idealized line source.

FIG. 2 shows a profile of an illumination line which would be ideally suitable for illuminating a spatial light modulator. In the y-axis direction, the beam has a narrow substantially Gaussian profile 10. In the x-axis, radiation from all emitters overlaps to form a line 11 with a characteristic top-hat shape. Line 11 will typically have less variation than individual emitter profiles.

The bars 15 illustrated in FIG. 4 are examples of narrow package bars, which are not much wider in the x-axis than the diode array chip. This facilitates close side-by-side mounting. An example of such a bar is supplied by Coherent Inc of Santa Clara, Calif. under part number B1-83-50C-19-30-B. This laser diode bar is a fluid cooled 50W bar comprising 19 emitters with a 30% fill factor. Fill factor is defined as the percentage of the x-axis array dimension occupied by radiation emitting emitters. The diode bar may be cooled by any suitable mechanism such as a suitable convective, conductive or fluid-based mechanism.

Microlens 21 is an optical element suitable for collimating the fast axis of a laser diode bar. It collects the high numerical aperture beams from the laser emitters in the y-axis without significant degradation in the beam quality. A spherical, aspherical or a graded index element may be used. Microlenses for fast axis collimation are available from Blue Sky Research (Milpitas, Calif.), LIMO—Lissotschenko Mikrooptik GmbH (Dortmund, Germany) and NSG America, Inc (Somerset, N.J.).

Microlens array 22 is an array of microlenses which are spaced apart at a pitch determined by the emitter geometry. The degree of overlap between the emitter radiation profiles is selected by choosing the pitch of the microlens array to be less than the pitch of the emitters on the laser diode array. A microlens pitch slightly less than the emitter pitch will steer the radiation from outer emitters towards a central target point causing the radiation to overlap.

There will be some dead space between bar packages 15 that must be taken into account. It is possible to provide two individual microlens arrays, one located to collect radiation from each bar package 15. It is less expensive and simpler to use a single array element where a few microlenses in the center are not used. For example, for a 1 cm laser diode array with 19 emitters spaced 500 $\mu$m apart the spacing between adjacent microlenses will be slightly less than 500 $\mu$m. A 2 mm dead space between bars would result in not using four of the microlenses.

There are several options for aligning the bars 15 and their associated collecting optics. One possibility is to fix the first bar 15, and then align the collecting optics with the first bar to achieve a desired line profile 25 at a target plane. The collecting optics can then be fixed in place. The second bar 15 can then be aligned to produce substantially the same line profile at the target plane. Another possibility is to fix the position of the collecting optics and then align both bars 15 to the optics. It may be necessary to roughly align each element and then more finely align the elements to achieve the desired line profile.

Figure 5:
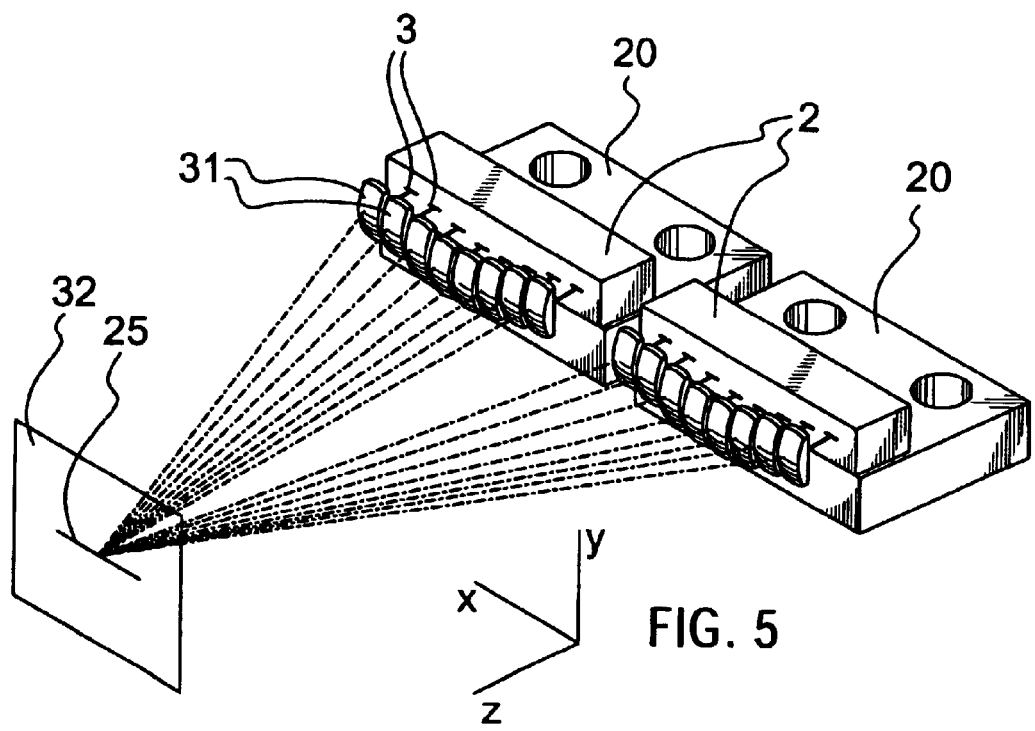
FIG. 5 depicts an embodiment of the invention that combines the radiation from two laser diode bars using microlenses associated with each emitter.

FIG. 5 shows an embodiment of the invention which facilitates compensating for misalignments between laser diode bars 15 in the x-y plane and/or deviations from straightness of the laser emitters. In FIG. 5, laser diode arrays 2 are each mounted on a base 20. Individual microlenses 31 are placed in front of each emitter of laser diode arrays 2. Microlenses 31 are aligned in the y-axis direction to direct all emitter images toward line 25 so that they overlap in the y-axis direction at a target plane. Radiation from the different emitters is also overlapped in the x-axis direction at the target plane, either partially or completely, by aligning each microlens 31 in the x-axis.

Microlenses 31 may be fabricated, for example, by slicing a molded aspheric microlens into slices equal in thickness to the pitch of the radiation emitting areas. An example of such a molded aspherical lens is available as part number 350140 from Geltech of Alachua, Fla., U.S.A. A micromanipulator may be used to align microlenses 31 on a suitable support. When the microlenses are in desired positions they may be held in place using suitable adhesives. For example, an epoxy adhesive mixed with fine glass powder may be used to secure microlenses 31 in place. Microlenses 31 could also be held in place by suitable mechanical holders.

An advantage of this embodiment is that the radiation from each emitter can be individually aligned. This permits very precise overlapping at a target plane. With care, an extremely tight overlap can be achieved maximizing brightness.

Figure 6:
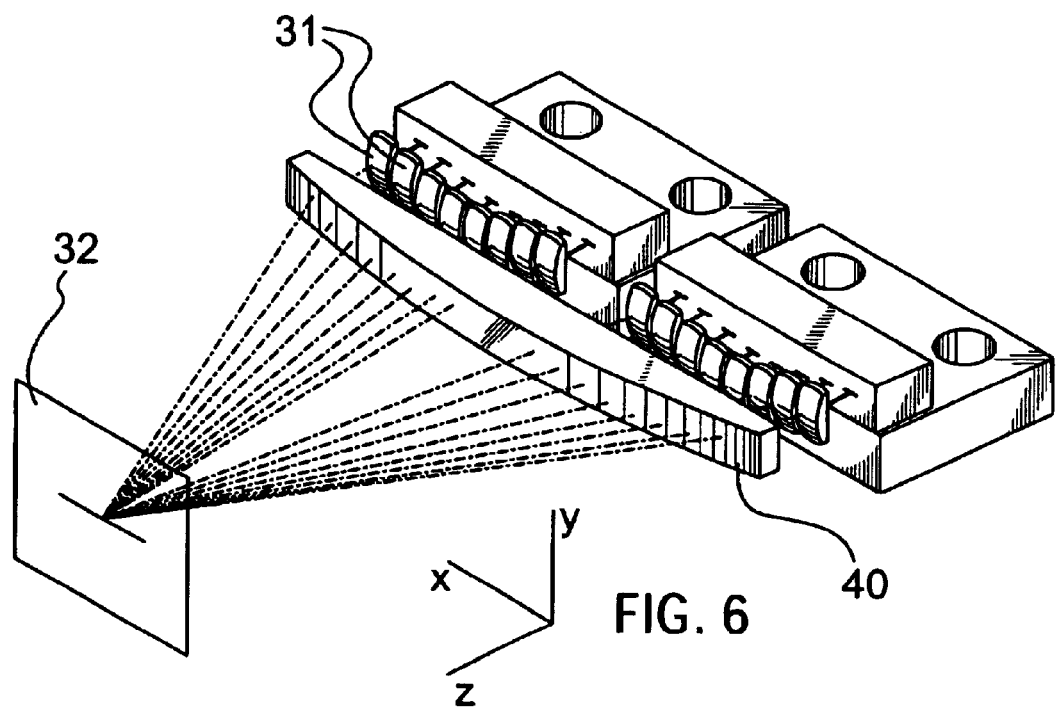
FIG. 6 depicts an alternative embodiment of the invention advantageous in reducing off-axis aberration from the microlenses; and, FIG. 7 depicts an embodiment of the invention that combines two laser diode arrays on a common base.

Yet another embodiment shown in FIG. 6 has particular application where a distance between target plane 32 and microlenses 31 is reduced thus increasing the steering angle for outer emitter microlenses. Microlenses located away from the center must provide much more steering towards the target than do central microlenses. The outer microlenses end up aligned well off their optical axes resulting in off-axis optical aberrations. The aberrations can degrade the uniformity of the line profile, which will likewise degrade the combined profile of all emitters.

In FIG. 6 an optical element 40 is introduced in front of the microlens array. Element 40 steers the radiation towards the centre of target plane 32 for outer emitters and has a smaller effect on radiation from central emitters. In this embodiment, microlens elements 31 are not required to steer the radiation in the x-z plane since this steering is now mostly provided by optical element 40. Microlens elements 31 can still provide minor corrections to steering but off-axis aberrations are reduced by the inclusion of optical element 40.

Optical element 40, can also be added to the embodiment depicted in FIG. 4 or any of the other embodiments detailed in this disclosure. In each case, the addition of element 40 reduces the steering requirement on the microlens elements, thus reducing off-axis aberrations from outer emitter/microlens combinations.

Figure 7:
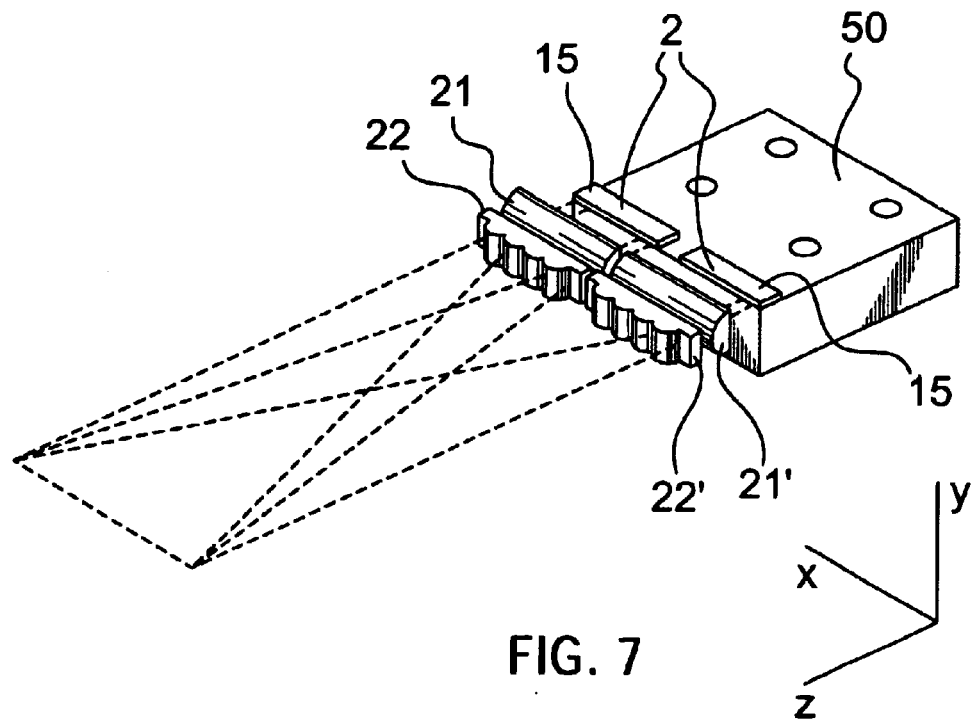

FIG. 7 depicts an embodiment of the invention in which two laser diode arrays are combined in a single package. This embodiment is useful in situations where space limitations are severe or where long-term stability of the diode bar position is a critical issue. The dead space between adjacent bars can also be further reduced since the array positioning is now only dependent on array placement tolerances and not additional mechanical mounting tolerances. The common base also provides improved long-term stability of the relative bar positions since, in general, array bonding processes will result in lower long term drift than mechanically mounting two separate packages. The term "bonding" is used to indicate a process whereby the laser diode array is permanently fixed to a base. Improved stability is important in cases where the collimating optics are very sensitive to misalignment or when the absolutely highest line quality is sought.

In FIG. 7, two laser diode arrays 2 are each bonded to a common base 50. The collecting elements are shown split into two pieces 21 and 21', 22 and 22'. The need to split the optical elements for collimating each laser diode array depends on the optical sensitivity of the collimating elements and the mounting accuracy of the arrays. It is unlikely that laser diode array mounting tolerances can be controlled to a degree where a single element can be used as was shown in the previous embodiment of FIG. 4. Because the arrays are in fixed orientation after bonding, any alignment error between the two bars could not be eliminated if a one-piece collimation element were used.

The collecting schemes of the embodiments shown in FIG. 5 and FIG. 6 can also be applied to the embodiment shown in FIG. 7. In this case individual microlenses are simply aligned to collect and direct the radiation from each emitter to a target.

The line of light produced by any of the above embodiments may be directed onto a spatial light modulator.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. An apparatus for illuminating a spatial light modulator, the apparatus comprising:

two or more laser diode arrays, each having a plurality of radiation emitting areas, the laser diode arrays mounted adjacent to each other with their radiation emitting areas substantially in a common plane and in a substantially straight line extending in an x-axis direction;

collecting optics comprising at least one optical element disposed to collect beams of radiation from the radiation emitting areas and direct the beams of radiation to at least partially overlap at the spatial light modulator.

2. The apparatus of claim 1 wherein each of the laser diode arrays is formed on a separate semiconductor substrate.

3. The apparatus of claim 2 wherein the collecting optics comprises an array of microlenses.

4. The apparatus of claim 3 wherein the radiation emitting areas are spaced apart from one another with a first pitch and the microlenses in the array of microlenses are spaced apart from one another with a second pitch less than the first pitch.

5. The apparatus of claim 3 wherein the microlenses are individually aligned with the corresponding emitting areas in a y-axis direction.

6. The apparatus of claim 5 wherein the microlenses are located to steer radiation beams from the corresponding emitting areas so that the radiation beams converge toward the spatial light modulator.

7. The apparatus of claim 5 wherein the collecting optics comprises an optical element arranged to steer beams of radiation from the emitting areas toward the spatial light modulator.

8. The apparatus of claim 7 wherein the optical element comprises a cylindrical lens.

9. The apparatus of claim 8 wherein the cylindrical lens has no power in a fast axis perpendicular to the line of emitting areas.

10. The apparatus of claim 3 wherein radiation from each of the radiation emitting areas of the laser diode arrays is received by a corresponding microlens of the array of microlenses.

11. The apparatus of claim 1 wherein the collecting optics comprises a fast axis collimation optical element located to collimate radiation in a fast axis of the radiation emitting areas.

12. The apparatus of claim 11 wherein the collecting optics comprises an array of microlenses.

13. The apparatus of claim 12 wherein the radiation emitting areas are spaced apart from one another with a first pitch and the microlenses in the array of microlenses are spaced apart from one another with a second pitch less than the first pitch.

14. The apparatus of claim 12 wherein the fast axis collimation element is located between the radiation emitting areas and the array of microlenses.

15. The apparatus of claim 12 wherein radiation from each of the radiation emitting areas of the laser diode arrays is received by a corresponding microlens of the array of microlenses.

16. The apparatus of claim 12 wherein the fast axis collimation optical element is located between the emitting areas and the array of microlenses.

17. The apparatus of claim 16 wherein the fast axis collimation optical element comprises a cylindrical lens.

18. The apparatus of claim 1 wherein the collecting optics comprises a plurality of arrays of microlenses, each array of microlenses corresponding to one of the laser diode arrays.

19. The apparatus of claim 18 wherein each array of microlenses comprises one microlens located to receive radiation from a corresponding radiation emitting area of the corresponding laser diode array.

20. A method for combining radiation from two or more laser diode arrays, each of said arrays having a front surface, said front surface having a plurality of emitting areas thereon, said method comprising forming an illumination line on a spatial light modulator by:

providing two or more laser diode arrays mounted on a common base with said front surfaces substantially in a common emitting plane and adjacent to each other, said emitting areas of said two or more laser diode arrays forming a substantially straight line in said common emitting plane;

collecting radiation from both of said laser diode arrays in a fast axis extending substantially perpendicular to said straight line and directing said radiation toward a spatial light modulator, said spatial light modulator spaced apart from said common emitting plane; and, collecting and steering said radiation in a slow axis, the slow axis extending substantially parallel to said straight line, toward said spatial light modulator wherein light originating from the two or more laser diode arrays at least partially overlaps at the spatial light modulator.

21. The method of claim 20 comprising bonding said laser diode arrays to the base.

22. The method of claim 20 comprising:

bonding each of said laser diode arrays to an intermediate base; and, mounting each of said intermediate bases on the common base.

23. The method of claim 20 wherein collecting radiation from both of said laser diode arrays in a fast axis extending substantially perpendicular to said straight line comprises passing light from the laser diode arrays through a cylindrical lens.

24. The method of claim 20 wherein collecting and steering said radiation in a slow axis comprises passing said radiation through an array of microlenses.

25. The method of claim 20 wherein the array of microlenses extends substantially parallel to the slow axis.

* * * * *